(12) United States Patent
Huang

(10) Patent No.: US 10,475,730 B2
(45) Date of Patent: Nov. 12, 2019

(54) PREFORMED LEAD FRAME DEVICE AND LEAD FRAME PACKAGE INCLUDING THE SAME

(71) Applicant: Chang Wah Technology Co., Ltd., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/456,019

(22) Filed: Mar. 10, 2017

(65) Prior Publication Data

US 2017/0263542 A1   Sep. 14, 2017

(30) Foreign Application Priority Data

Mar. 14, 2016   (TW) ............... 105203479 U

(51) Int. Cl.
  *H01L 23/495* (2006.01)
  *H01L 23/31* (2006.01)
  *H01L 21/48* (2006.01)
  *H01L 21/56* (2006.01)

(52) U.S. Cl.
  CPC .... *H01L 23/49586* (2013.01); *H01L 21/4832* (2013.01); *H01L 21/561* (2013.01); *H01L 23/3107* (2013.01); *H01L 23/3121* (2013.01); *H01L 23/4952* (2013.01); *H01L 23/49503* (2013.01); *H01L 23/49537* (2013.01); *H01L 23/49548* (2013.01); *H01L 23/49541* (2013.01); *H01L 2224/48091* (2013.01); *H01L 2224/48247* (2013.01)

(58) Field of Classification Search
  CPC .. H01L 23/495; H01L 23/49558; H01L 23/52
  See application file for complete search history.

(56) References Cited

U.S. PATENT DOCUMENTS

| | | | | |
|---|---|---|---|---|
| 2002/0014693 A1* | 2/2002 | Pollock | ............... | H01L 23/3121 257/724 |
| 2007/0001278 A1* | 1/2007 | Jeon | ...................... | H01L 21/561 257/676 |
| 2013/0299960 A1* | 11/2013 | Chan | ..................... | H01L 33/642 257/706 |

* cited by examiner

Primary Examiner — Jay C Chang
Assistant Examiner — Mikka Liu
(74) Attorney, Agent, or Firm — DLA Piper LLP (US)

(57) ABSTRACT

A preformed lead frame device includes a molding layer and a plurality of spaced-apart lead frame units. The molding layer is made of a polymer material, and includes a plurality of framed portions, and a plurality of longitudinal and transverse frame sections intersecting each other to frame the framed portions. The lead frame units are arranged in an array and made of metal. Each of the lead frame units is embedded in a respective one of the framed portions and includes a plurality of spaced-apart leads.

9 Claims, 9 Drawing Sheets

PREFORMED LEAD FRAME DEVICE AND LEAD FRAME PACKAGE INCLUDING THE SAME

CROSS-REFERENCE TO RELATED APPLICATION

This application claims priority of Taiwanese Patent Application No. 105203479, filed on Mar. 14, 2016.

FIELD

The disclosure relates to a lead frame device, and more particularly to a preformed lead frame device used for a single-chip package. The disclosure also relates to a lead frame package including the preformed lead frame device.

BACKGROUND

A quad flat no-lead (QFN) package typically has a size smaller than that of a leaded chip carrier package including a plurality of pins extending outwardly. In addition, since the QFN package has a relatively short signal transmission path and a relatively high transmission speed, the QFN package is suitably applied to high frequency and high speed electronic devices.

Referring to FIG. 1, one of packaged lead frame units of a conventional QFN package includes a frame portion 11, a die pad 12 surrounded by the frame portion 11, a plurality of spaced-apart leads 13 extending from the frame portion 11 toward the die pad 12, a chip 14 mounted on the die pad 12, a plurality of wires 15 connected between the chip 14 and the leads 13, and a connecting portion 16 extending from the die pad 12 to the frame portion 11 for supporting the die pad 12.

However, since the frame portion 11 and the leads 13 are both made from metal, such as copper, a dicing tool is likely to be damaged when the packaged lead frame units are singularized by dicing along scribing lines (shown in FIG. 1 as imaginary lines that pass through the connecting portion 16 and the leads 13) with the dicing tool.

SUMMARY

Therefore, an object of the disclosure is to provide a preformed lead frame device that can alleviate at least one of the drawbacks of the prior art.

According to one aspect of the disclosure, the preformed lead frame device includes a molding layer and a plurality of spaced-apart lead frame units. The molding layer is made of a polymer material and includes a plurality of framed portions, and a plurality of longitudinal and transverse frame sections intersecting each other to frame the framed portions. The lead frame units are arranged in an array and made of metal. Each of the lead frame units is embedded in a respective one of the framed portions and includes a plurality of spaced-apart leads.

According to another aspect of the disclosure, a lead frame package includes a preformed lead frame device, a plurality of chips, and a plurality of wire sets.

The preformed lead frame device includes a molding layer and a plurality of spaced-apart lead frame units. The molding layer is made of a polymer material and includes a plurality of framed portions, and a plurality of longitudinal and transverse frame sections intersecting each other to frame the framed portions. The lead frame units are arranged in an array and made of metal. Each of the lead frame units is embedded in a respective one of the framed portions and includes at least one die pad, and a plurality of spaced-apart leads. The at least one die pad has a mounting surface for mounting a corresponding one of the chips and a bottom surface that is opposite to the mounting surface. The mounting surface and the bottom surface of the at least one die pad are respectively exposed from topmost and bottommost surfaces of the molding layer. The leads of each of the lead frame units surround and are spaced apart from the die pad of the lead frame unit.

Each of the chips is disposed on the at least one die pad of a corresponding one of the lead frame units.

Each of the chips is electrically connected with the leads of the corresponding one of the lead frame units by a respective one of the wire sets.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
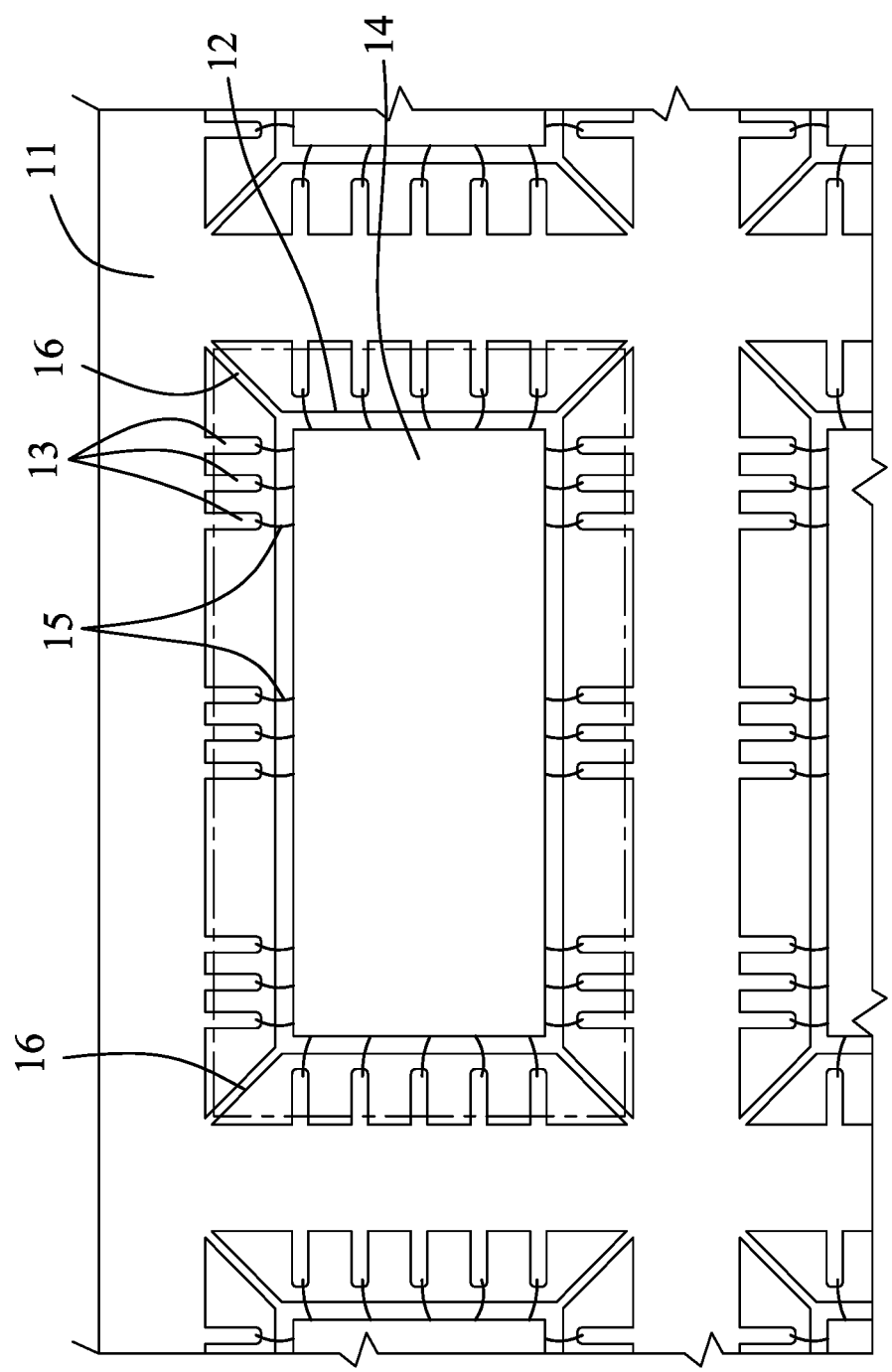
FIG. 1 is a schematic top view illustrating fragmentary packaged lead frame units of a conventional quad flat no-lead package.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
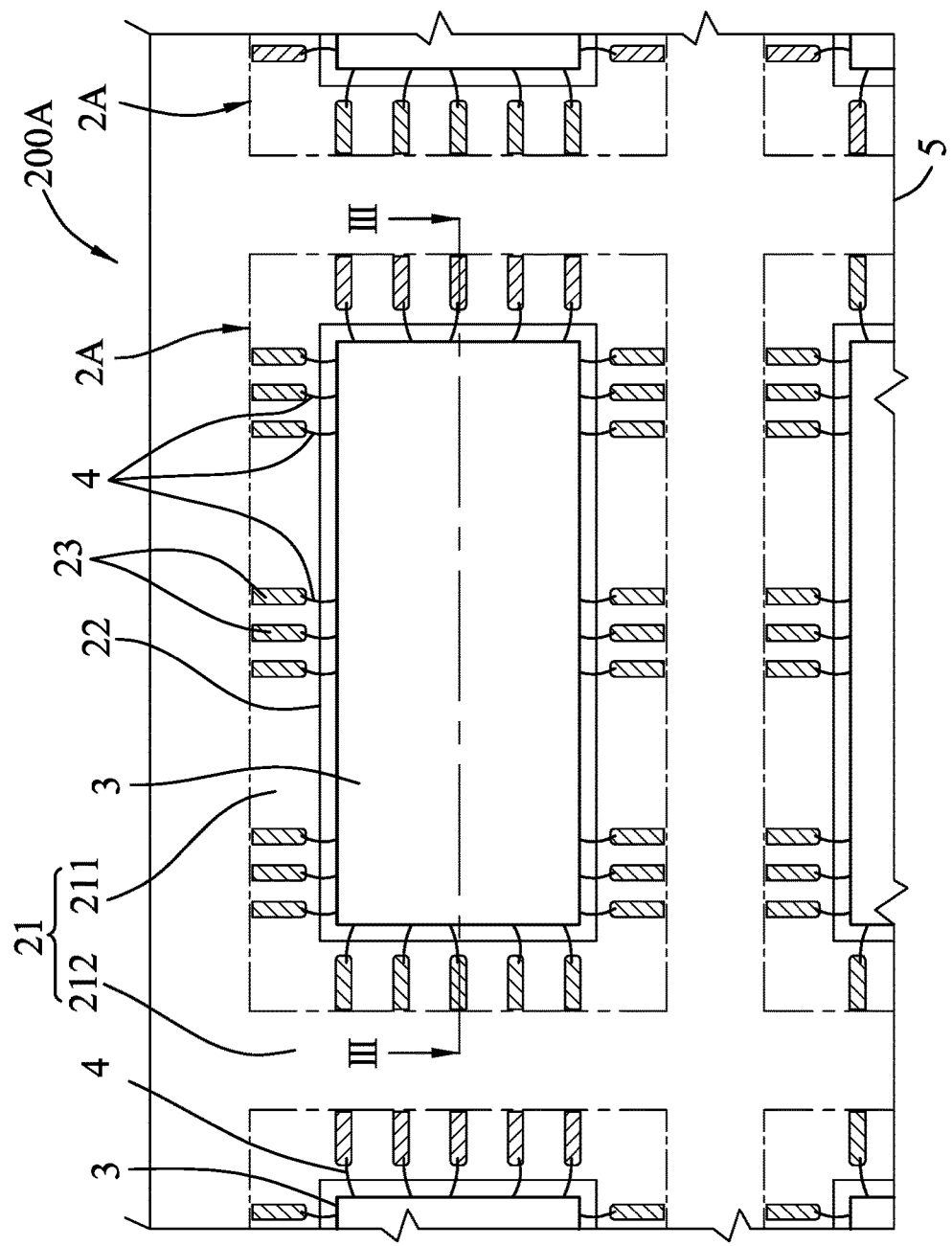
FIG. 2 is a fragmentary schematic top view illustrating an embodiment of a lead frame package according to the disclosure.
Figure 3:
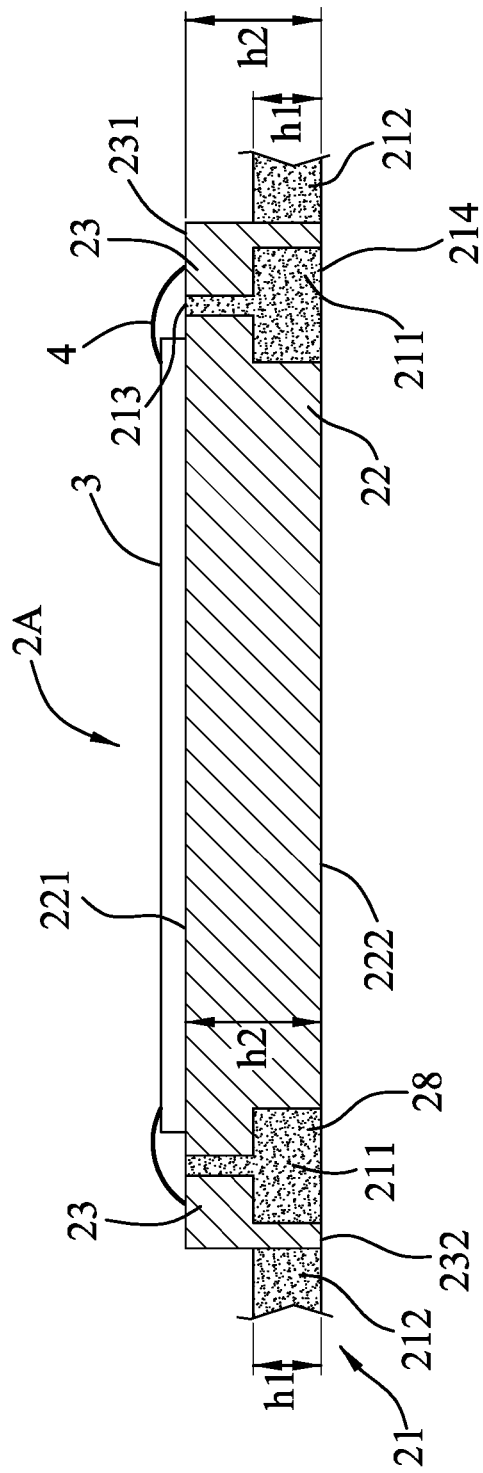
FIG. 3 is a fragmentary cross-sectional view taken along line III-III of FIG. 2 and illustrating one of lead frame units of the lead frame package attached with a chip and a wire set.

Referring to FIGS. 2 and 3, the embodiment of the lead frame package according to the disclosure includes a preformed lead frame device 200A, a plurality of chips 3, a plurality of wire sets 4, and an encapsulant 5.

The preformed lead frame device 200A includes a molding layer 21, and a plurality of spaced-apart lead frame units 2A.

The molding layer 21 is made of a polymer material, and includes a plurality of framed portions 211, and a plurality of longitudinal and transverse frame sections 212 intersecting each other to frame the framed portions 211.

The spaced-apart lead frame units 2A are arranged in an array and made of metal. Each of the lead frame units 2A is embedded in a respective one of the framed portions 211, and includes at least one die pad 22 and a plurality of spaced-apart leads 23.

The at least one die pad 22 of each of the lead frame units 2A has a mounting surface 221 for mounting a corresponding one of the chips 3, and a bottom surface 222 that is opposite to the mounting surface 221. The mounting surface 221 and the bottom surface 222 are respectively exposed from topmost and bottommost surfaces 213, 214 of the molding layer 21.

In each of the lead frame units 2A, the leads 23 surround and are spaced from the die pad 22 such that a gap 28 is formed among the leads 23 and the at least one die pad 22.

More specifically, in each of the lead frame units 2A, each of the leads 23 has a top surface 231 that is flush with the topmost surface 213 of the molding layer 21 and the mounting surface 221 of the at least one die pad 22, and a bottom surface 232 that is flush with the bottommost surface 214 of the molding layer 21 and the bottom surface 222 of the at least one die pad 22.

The longitudinal and transverse frame sections 212 of the molding layer 21 have a first height (h1) from the bottommost surface 214 of the molding layer 21. In each of the lead frame units 2A, each of the leads 23 and the at least one die pad 22 have a second height (h2) from the bottommost surface 214 of the molding layer 21. The first height (h1) is smaller than the second height (h2) such that the longitudinal and transverse frame sections 212 are indented from the topmost surface 213 of the molding layer 21.

Each of the chips 3 is disposed on the at least one die pad 22 of a corresponding one of the lead frame units 2A, and is electrically connected with the leads 23 of the corresponding one of the lead frame units 2A by a respective one of the wire sets 4.

In one form, each of the lead frame units 2A may be free of the die pad 22, and the chips 3 may be respectively connected to the leads 23 using flip-chip techniques, etc.

The encapsulant 5 encapsulates the chips 3, the wire sets 4, the die pads 22 and the leads 23 of the lead frame units 2A.

Since the molding layer 21 is made from electrically insulating material, the lead frame units 2A are electrically disconnected from each other. Thus, electrical tests for the chip 3 disposed on the at least one die pad 22 of the corresponding one of the lead frame units 2A can be conducted on a board prior to dicing along the longitudinal and transverse frame sections 212. Thus, damage to dicing tools (e.g., dicing blades) caused by dicing metal materials can be avoided.

Figure 4:
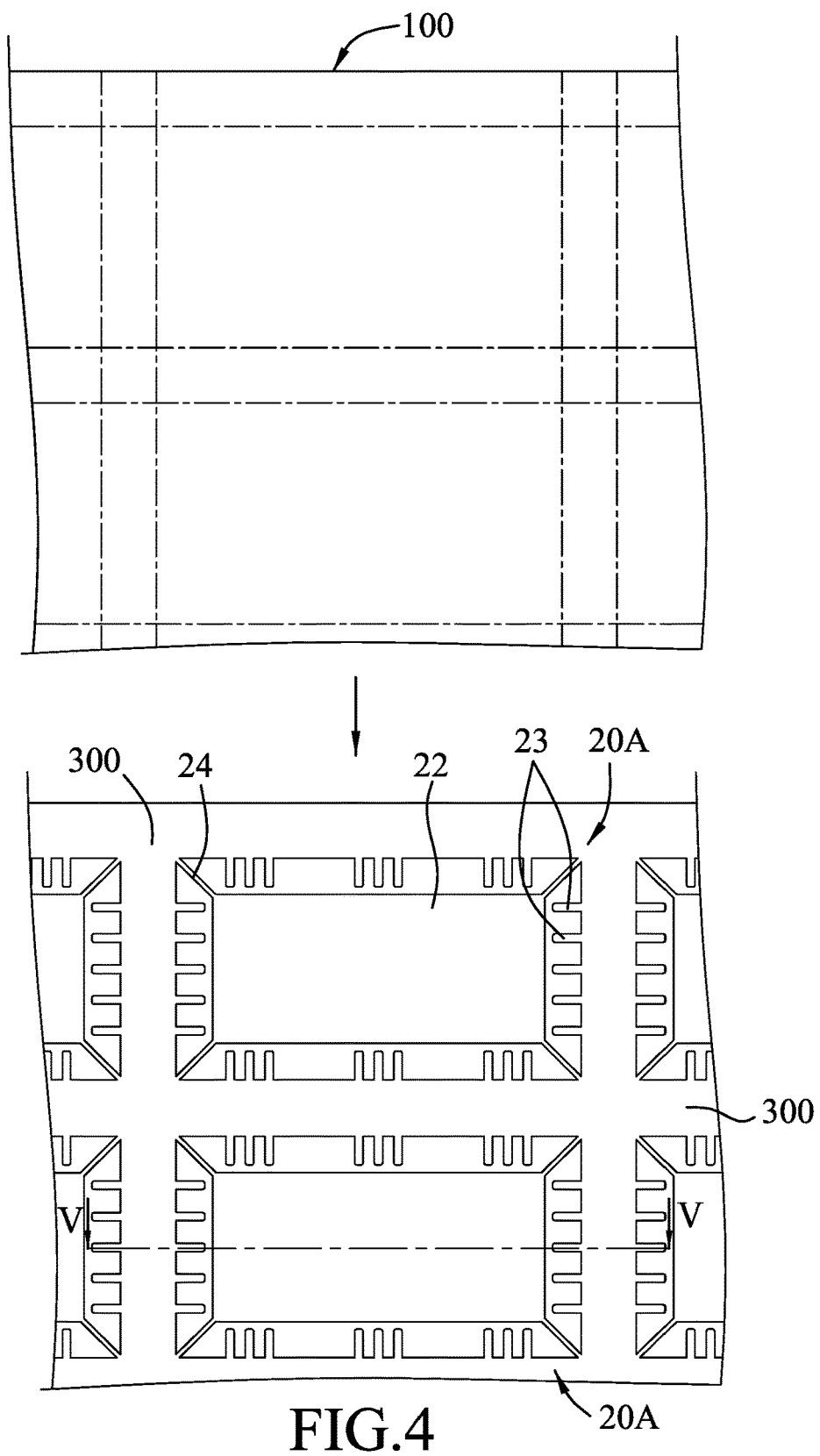
FIG. 4 is a fragmentary schematic top view illustrating one of the lead frame units included in the lead frame package after a bottom surface of a conductive substrate is etched.
Figure 5:
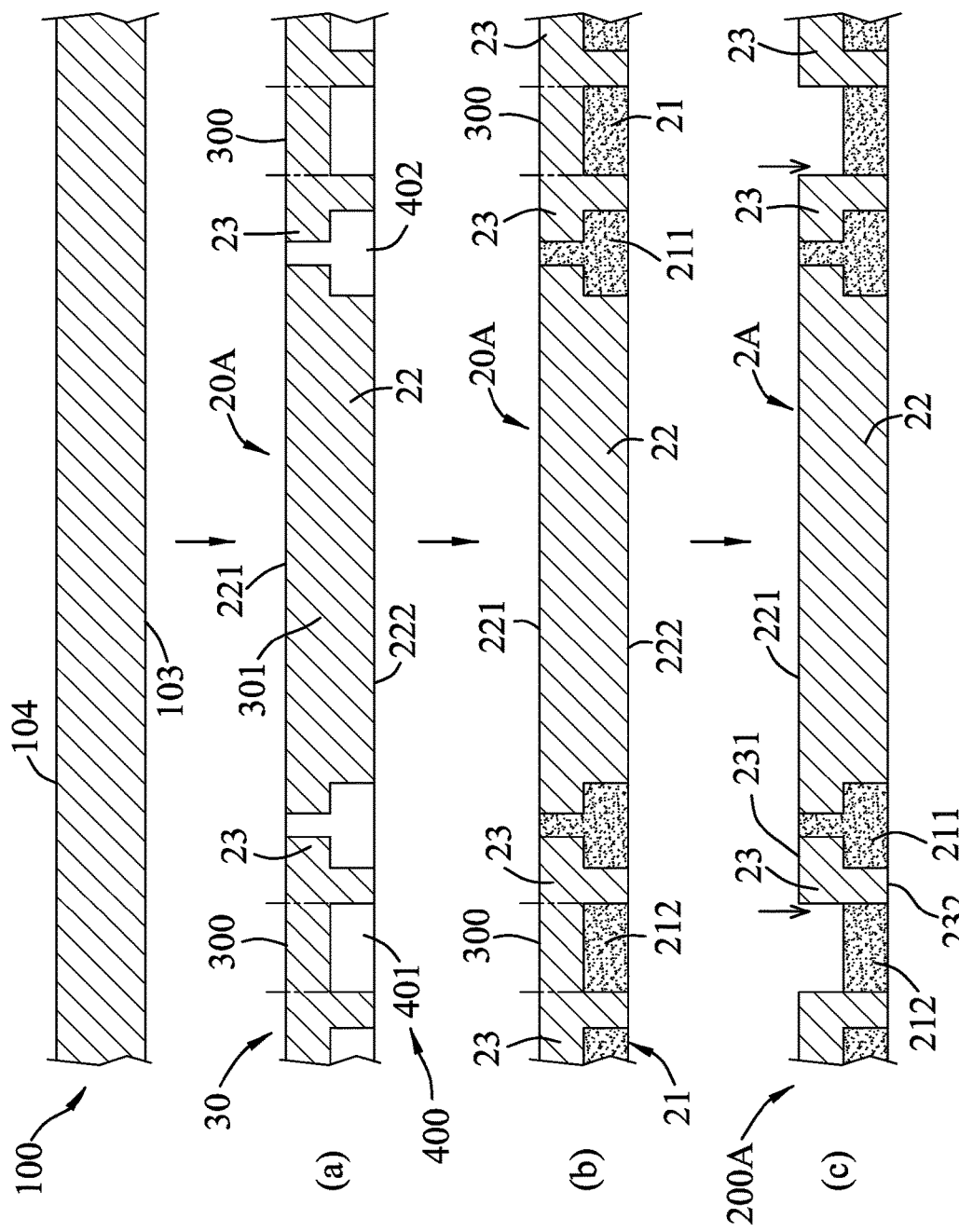
FIG. 5 is a fragmentary cross-sectional view illustrating consecutive steps of a method of making a preformed lead frame device illustrated in FIG. 4.

Referring to FIGS. 4 and 5, a method of making the embodiment of a lead frame package according to the disclosure is illustrated and mentioned as below.

First, as shown in step (a) of FIG. 5, a conductive substrate 100 is etched from a bottom surface 103 of the conductive substrate 100 to form a patterned trench 400 that is indented from the bottom surface 103 of the conductive substrate 100.

The patterned trench 400 includes intersecting longitudinal and transverse trench sections 401 that are indented upwardly from the bottom surface 103 of the conductive substrate 100 to a level below a top surface 104 of the conductive substrate 100.

An un-etched region 30 of the conductive substrate 100 includes a plurality of longitudinal and transverse frame sections 300 that are formed along and above the longitudinal and transverse trench sections 401 and that intersect each other to define a plurality of framed regions 301, and a plurality of the lead frame units 20 A. Each of the lead frame units 20A is disposed in one of the framed regions 301, and includes the at least one die pad 22, the spaced-apart leads 23, and four die pad support ribs 24 that respectively contact the at least one die pad 22 to adjacent ones of the longitudinal and transverse frame sections 300. The patterned trench 400 further includes the gaps 402 that extend through the top and bottom surfaces 104, 103 of the conductive substrate 100. In one form, a number of the die pad support ribs 24 may be one.

It is noted that the configuration of the longitudinal and transverse frame sections 300 of the conductive substrate 100 may be modified based on actual practice and design.

In step (b), the conductive substrate 100 formed with the patterned trench 400 is disposed in a mold (not shown), and then a molding material selected from an insulating material, such as epoxy resin, is filled in the longitudinal and transverse trench sections 401 and the gaps 402 to form the molding layer 21 that uncovers the mounting and bottom surfaces 221, 222 of the at least one die pad 22 of each of the lead frame units 2A and the top and bottom surfaces 231, 232 of the leads 23 of the lead frame units 2A.

Thereafter, in step (c), the longitudinal and transverse frame sections 300 of the un-etched region 30 and the at least one die pad support rib 24 are removed by etching the conductive substrate 100 from the top surface 104 of the conductive substrate 100 until the molding material filled in the longitudinal and transverse trench sections 401 of the patterned trench 400 is exposed to form the preformed lead frame device 200A.

Then, each of the chips 3 is respectively mounted on the mounting surface 221 of the at least one die pad 22 of a corresponding one of the lead frame units 2A, and the wire sets 4 are connected between the chip and the leads of the corresponding lead frame unit 2A. Finally, the encapsulant (not shown) is formed to encapsulate the chips 3, the wire sets 4, the die pads 22 and the leads 23 of the lead frame units 2A.

Since the longitudinal and transverse frame sections 300 of the un-etched region 30 of the conductive substrate 100 are removed, the longitudinal and transverse frame sections 212 of the preformed lead frame device 200A are made of the molding material and free of metal. Thus, the lead frame units 2A are electrically insulated from each other, and damage caused by using the dicing blades can be avoided.

Figure 6:
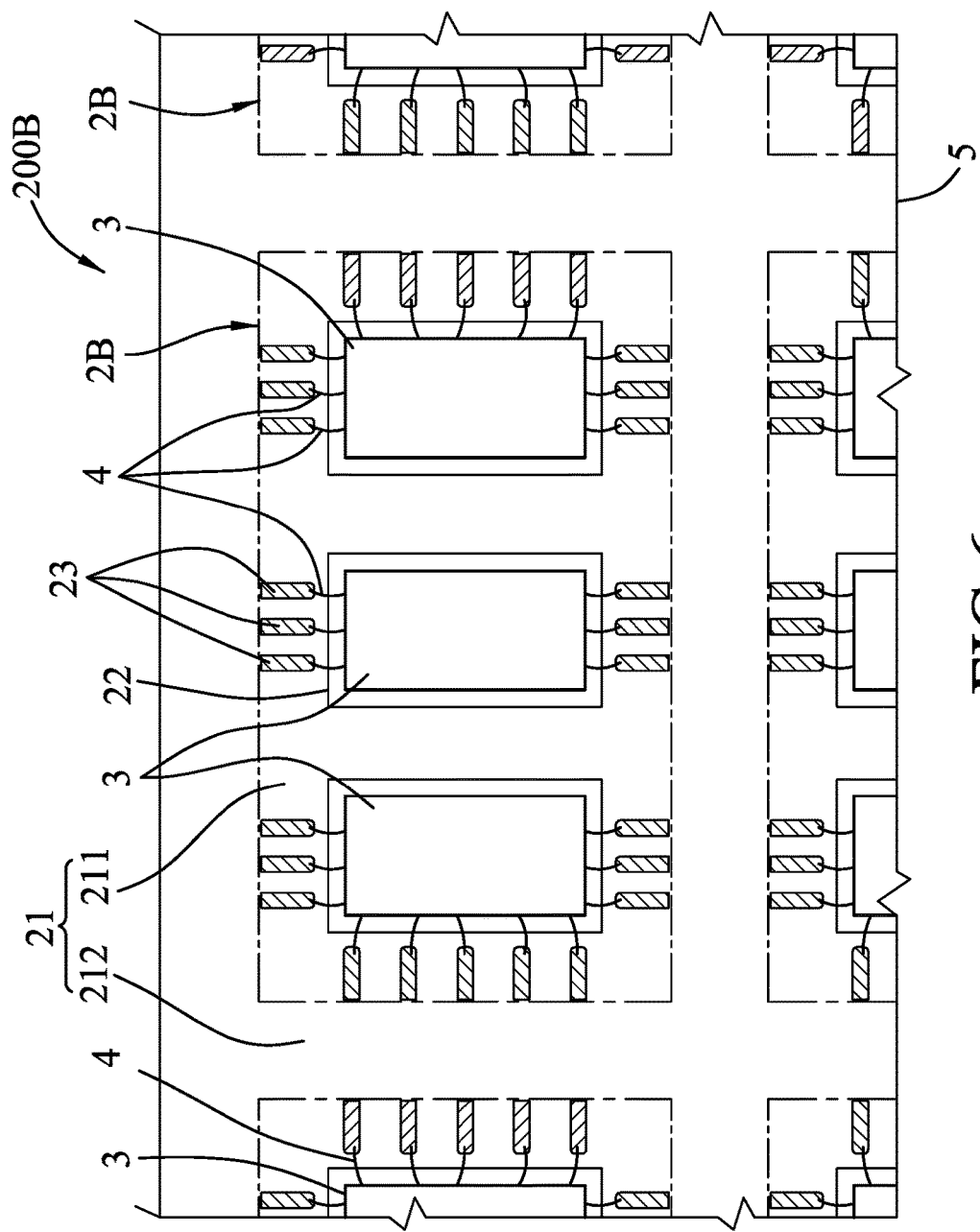
FIG. 6 is a fragmentary top view illustrating another variation of the embodiment of the lead frame package.
Figure 7:
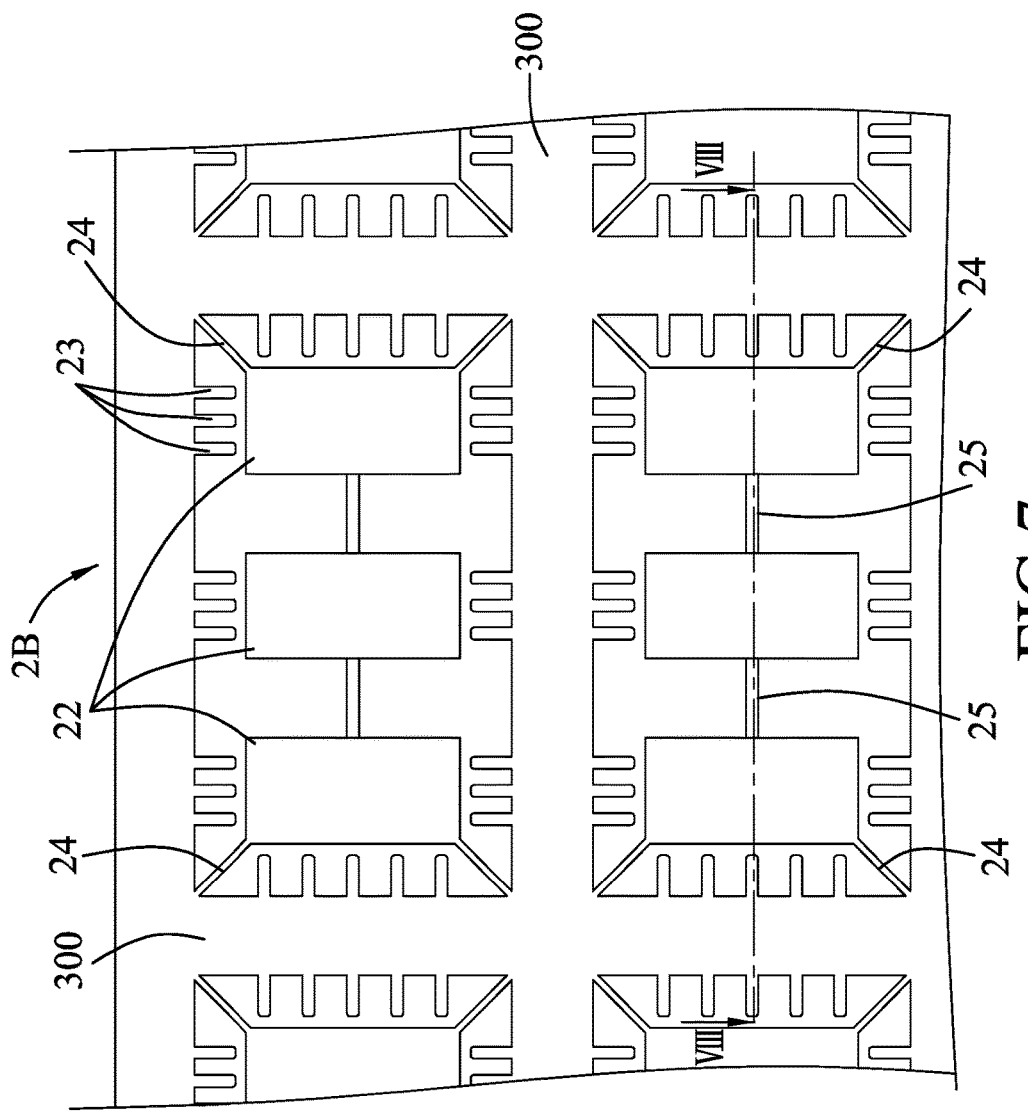
FIG. 7 is a fragmentary top view illustrating one of the lead frame units included in the lead frame package formed with a plurality of die pads.
Figure 8:
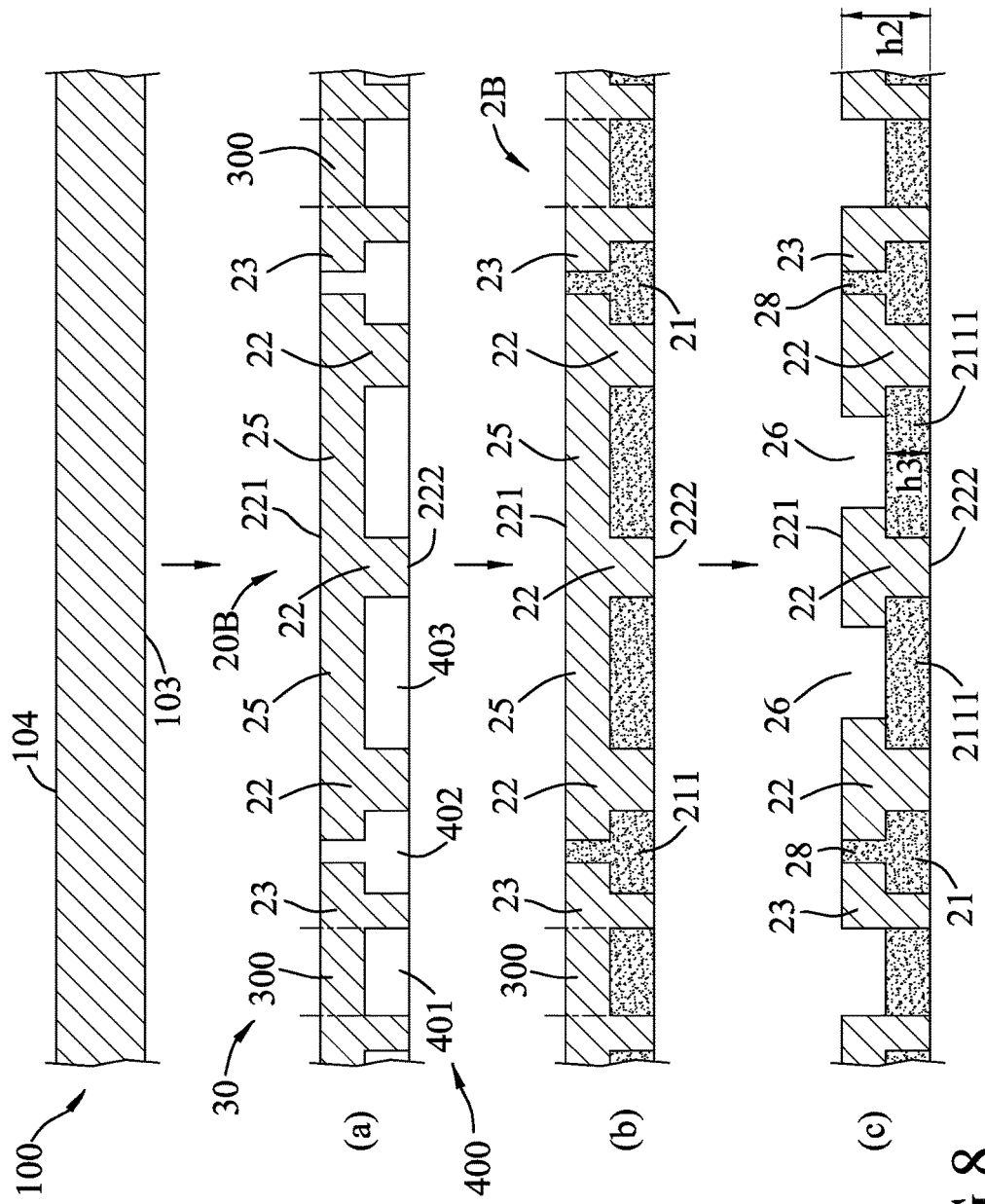
FIG. 8 is a fragmentary schematic view illustrating consecutive steps of the method of making the preformed lead frame device illustrated in FIG. 7.

Referring to FIGS. 6 to 8, another configuration of the embodiment of the lead frame package 200B is illustrated. Each of the lead frame units 2B includes a plurality of spaced-apart die pads 22 that are surrounded by the leads 23. Each of the framed portions 211 of the molding layer 21 includes at least one connecting part 2111 interconnecting two adjacent ones of the die pads 22. The die pads 22 are exemplified to be three, and the at least one connecting part 2111 are exemplified to be two.

More specifically, the at least one connecting part 2111 of each of the framed portions 211 has a third height (h3) from the bottommost surface 222 of the molding layer 21. The height (h3) is smaller than the second height (h2) such that upper portions of the die pads 22 of each of the lead frame units 2B are exposed from the framed portion 211 of the molding layer 21.

Since the die pads 22 of each of the lead frame units 2B are electrically insulated, the chips 3 mounted on the die pads 22 can be electrically and independently connected to an external device (not shown).

As shown in FIG. 6 and steps (a) to (c) of FIG. 8, the lead frame package 200B can be made by a method similar to the method of making the lead frame device 200A shown in FIG. 5, and the patterned trench 400 further includes at least one separation trench section 403 that is indented upwardly from the bottom surface 103 of the conductive substrate 100 to a level below the top surface 104 of the conductive substrate 100, and that is formed between the two adjacent ones of the die pads 22. More specifically, the die pad support ribs 24 respectively connect two opposite corners of each of outermost ones of the die pads 22.

In greater detail, the molding material is filled in the at least one separation trench 403 during the filling of the longitudinal and transverse trench sections 401 and the gaps 402. When the longitudinal and transverse frame sections 300 of the un-etched region 30 are removed, the at least one connecting portion 25 of each of the lead frame units 20B is removed together by etching the conductive substrate 100 from the top surface 104 of the conductive substrate 100 until the molding material filled in the at least one separation trench 403 is exposed. Since the at least one connecting portion 25 is removed after the molding layer 21 is formed in the at least one separation trench 403, the at least one connecting portion 25 is made of molding materials and free of metal.

The die pads 22 in FIGS. 7 and 8 are exemplified to be arranged in a line. A number and a shape of the die pads 22 may be adjusted based on actual practice.

Figure 9:
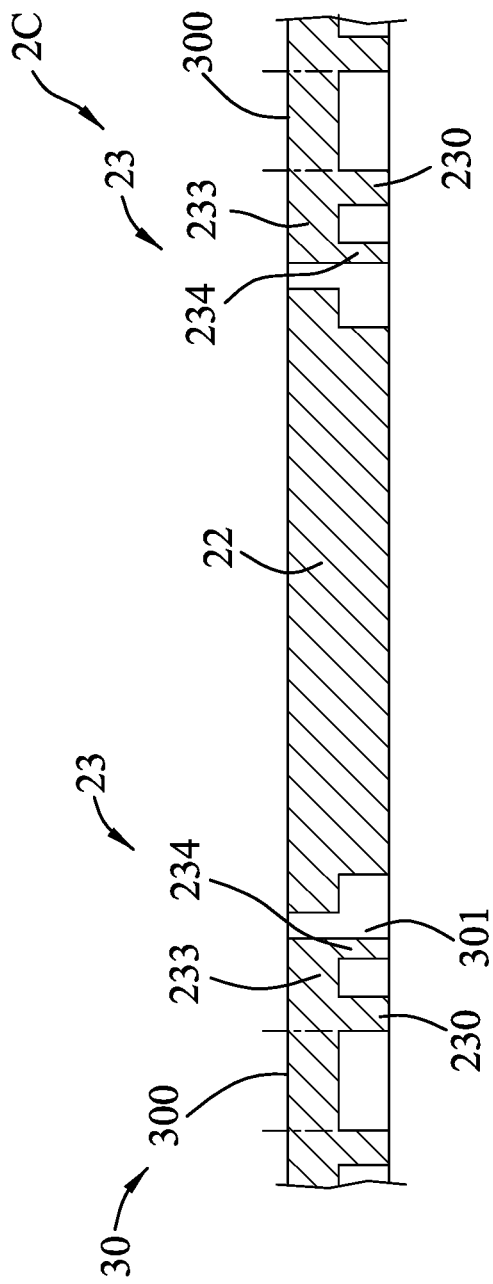
FIG. 9 is a fragmentarily schematic view illustrating the other variation of the lead frame device.

Referring to FIG. 9, the other configuration of the embodiment of the conductive substrate with the un-etched region 30 is illustrated. Each of the leads 23 of each of the lead frame units 2C further includes a base portion 230 spaced apart from the die pad 22 and contiguous with an adjacent one of said longitudinal and transverse frame sections 212 of said molding layer 21 (as shown in FIG. 2). The base portion 230 is formed with a leg portion 233 and a support portion 234 spaced apart from the leg portion 233. During filling of the molding material, the support portion 234 is adapted to abut against the mold so as to support the leg portion 233 during the filling of the molding material. Collapse and deformation of the leg portions 233 may be avoided or at least alleviated.

By virtue of the design of the preformed lead frame device 200A and the lead frame package 200B, the lead frame units 2A, 2B are respectively and electrically insulated, the damage to the dicing blades caused by dicing the metallic frame portion 11 of the conventional QFN package can be avoided, and the electrical test for the chips 3 can be conducted prior to dicing along the longitudinal and transverse frame sections 300. Furthermore, with the inclusion of the spaced-apart die pads 22 of each of the lead frame units 2B, more than one chip 3 can be packaged in the lead frame unit 2B.

The following examples pertain to further embodiments of the disclosure. Example 1 is directed to a method of making a preformed lead frame, comprising etching a conductive substrate from a bottom surface of the conductive substrate to form a patterned trench that is indented from the bottom surface of the conductive substrate, wherein the patterned trench includes intersecting longitudinal and transverse trench sections that are indented upwardly from the bottom surface of the conductive substrate to a level below a top surface of the conductive substrate, and an un-etched region of the conductive substrate includes a plurality of longitudinal and transverse frame sections that are formed along and above the longitudinal and transverse trench sections and that intersect each other to define a plurality of framed regions, and a plurality of lead frame units each of which is disposed in one of the framed regions and includes at least one die pad, a plurality of spaced-apart leads surrounding and spaced apart from the die pad, and at least one die pad support rib that connects the at least one die pad to an adjacent one of the longitudinal and transverse frame sections, the patterned trench further including a plurality of gaps formed among the leads, and the at least one die pad in each of the lead frame units, the gaps extending through the top and bottom surfaces of the conductive substrate; filling a molding material in the longitudinal and transverse trench sections and the gaps to form a molding layer that uncovers mounting and bottom surfaces of the at least one die pad of each of the lead frame units and top and bottom surfaces of the leads of the lead frame units; and removing the longitudinal and transverse frame sections of the un-etched region by etching the conductive substrate from a top surface of the conductive substrate until the longitudinal and transverse trench sections of the patterned trench are exposed.

Example 2 is directed to the method of example 1, wherein: the at least one die pad of each of the lead frame units includes a plurality of spaced-apart die pads; the patterned trench further includes at least one separation trench section that is indented upwardly from the bottom surface of the conductive substrate to a level below the top surface of the conductive substrate and that is formed between two adjacent ones of the die pads; each of the lead frame units further includes at least one connecting portion extending across the at least one separation trench section and connecting between two adjacent ones of the die pads; and the method further comprises filling the molding material in the at least one separation trench during the filling of the longitudinal and transverse trench sections and the gaps, and removing the at least one connecting portion of each of the lead frame units by etching the conductive substrate from the top surface of the conductive substrate until the molding material in the at least one separation trench is exposed.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A preformed lead frame device, comprising:
   a molding layer made of a polymer material and including a plurality of framed portions, and a plurality of longitudinal and transverse frame sections intersecting each other to frame said framed portions; and a plurality of spaced-apart lead frame units arranged in an array and made of metal, each of said lead frame units being embedded in a respective one of said framed portions and including a plurality of spaced-apart leads, wherein each of said leads of each of said lead frame units has a top surface that is flush with a topmost surface of said molding layer, and a bottom surface that is flush with a bottommost surface of said molding layer;

wherein each of said longitudinal and transverse frame sections of said molding layer has a first height (h1) from said bottommost surface of said molding layer; and wherein each of said leads of each of said lead frame units has a second height (h2) from said bottommost surface of said molding layer, the first height (h1) being smaller than the second height (h2) such that said longitudinal and transverse frame sections are indented from said topmost surface of said molding layer and serve as dicing paths.

2. The preformed lead frame device of claim 1, wherein each of said lead frame units further includes at least one die pad having a mounting surface for mounting a chip, and a bottom surface that is opposite to said mounting surface, said mounting surface and said bottom surface of said at least one die pad being respectively exposed from said topmost and bottommost surfaces of said molding layer, said leads of each of said lead frame units surrounding and being spaced apart from said die pad.

3. The preformed lead frame device of claim 2, wherein said top surface of each of said leads is flush with said mounting surface of said at least one die pad, and said bottom surface of each of said leads is flush with said bottom surface of said at least one die pad.

4. The preformed lead frame device of claim 3, wherein said at least one die pad of each of said lead frame units has the second height (h2) from said bottommost surface of said molding layer, which is greater than the first height (h1).

5. The preformed lead frame device of claim 4, wherein said at least one die pads includes a plurality of spaced-apart die pads surrounded by said leads, and each of said framed portions of said molding layer including at least one connecting part interconnecting two adjacent ones of said die pads.

6. The preformed lead frame device of claim 5, wherein, said at least one connecting part of each of said framed portions has a third height (h3) from said bottommost surface of said molding layer, the height (h3) being smaller than the second height (h2) of each of said leads and said spaced-apart die pads.

7. The preformed lead frame device of claim 2, wherein each of said leads includes a base portion that is contiguous with an adjacent one of said longitudinal and transverse frame sections of said molding layer and that has top and bottom surfaces respectively flush with said topmost and bottommost surfaces of said molding layer, and a leg portion that extends laterally from said base portion toward said die pad.

8. A lead frame package, comprising:
a preformed lead frame device as claimed in claim 1;
a plurality of chips, each of which disposed on said at least one die pad of a corresponding one of said lead frame units; and
a plurality of wire sets;
wherein each of said chips is electrically connected with said leads of the corresponding one of said lead frame units by a respective one of said wire sets.

9. The lead frame package of claim 8, further comprising an encapsulant that encapsulates said chips, said wire sets, said die pads and said leads of said lead frame units.

* * * * *